United States Patent [19]

Van Dyk Soerewyn

[11] 4,443,655

[45] Apr. 17, 1984

[54] EXTRUDED SEMICONDUCTOR PACKAGE AND FABRICATION METHOD

[75] Inventor: Herman F. Van Dyk Soerewyn, Peabody, Mass.

[73] Assignee: Unitrode Corporation, Lexington, Mass.

[21] Appl. No.: 325,279

[22] Filed: Nov. 27, 1981

[51] Int. Cl.³ ............................................. H05K 5/00
[52] U.S. Cl. ................................ 174/52 PE; 29/588; 357/72
[58] Field of Search ................ 174/52 PE; 357/72; 29/588

[56] References Cited

U.S. PATENT DOCUMENTS

| | | | |
|---|---|---|---|
| 3,699,394 | 10/1972 | Schuler | 174/52 PE |
| 3,793,570 | 2/1974 | Crouch et al. | 357/72 X |
| 4,172,272 | 10/1979 | Schneider | 174/52 PE X |

Primary Examiner—J. V. Truhe
Assistant Examiner—D. A. Tone
Attorney, Agent, or Firm—Weingarten, Schurgin, Gagnebin & Hayes

[57] ABSTRACT

A high power semiconductor package having an extruded metal housing which includes electrical terminals integrally formed with the housing and which, after assembly and encapsulation of the package, are electrically isolated by selected removal of intermediate sections of a housing wall.

15 Claims, 7 Drawing Figures

EXTRUDED SEMICONDUCTOR PACKAGE AND FABRICATION METHOD

FIELD OF THE INVENTION

This invention relates to electronic solid state power devices, and more particularly to a high power semiconductor package and fabrication method.

BACKGROUND OF THE INVENTION

High power solid state devices are usually contained in a package which includes a heat sink structure for thermal dissipation to prevent overheating and destruction of the sensitive semiconductor element or elements. In one known form of high power device, the package includes a flat metal base plate with a plastic shell attached thereon and in which the semiconductor elements and terminals are disposed and retained by a potting material which fills the shell. In an alternative configuration, an encapsulant is molded onto the base plate and encloses the electronic components and terminals. In a further alternative configuration, a four-sided cast or machined metal housing is employed and in which the components are mounted, the housing thereafter being filled with an encapsulant.

During assembly of the package, the electronic components and terminals must be maintained in precise position in the housing by appropriate fixturing apparatus prior to soldering of the package components and encapsulation of the housing. The requirement for fixturing apparatus adds to the manufacturing cost of the high power devices and can be an impediment to convenient handling of the devices during an assembly procedure.

SUMMARY OF THE INVENTION

A high power semiconductor package having an extruded metal housing which includes one or more electrical terminals integrally formed with the housing and which, after assembly and encapsulation of the package, are electrically isolated by selected removal of intermediate sections of a housing wall. The housing also includes elements integrally formed for retaining one or more semiconductor die assemblies and other electronic components. The electrical terminals are automatically positioned by their integral joinder to the housing, thereby eliminating the need for separate fixturing apparatus. After component assembly and encapsulation of the package, selected sections of the housing wall adjacent the electrical terminals are removed, such as by milling, sawing or grinding, to electrically isolate certain terminals from each other and/or from the housing.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
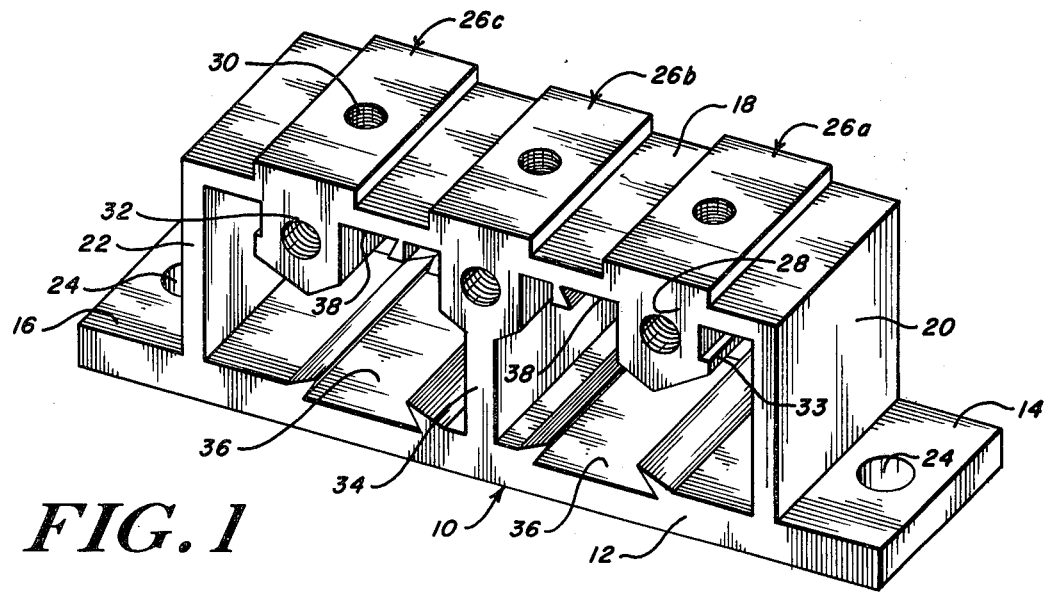
FIG. 1 is a pictorial view of an extruded housing in accordance with the invention.
Figures 2, 3:
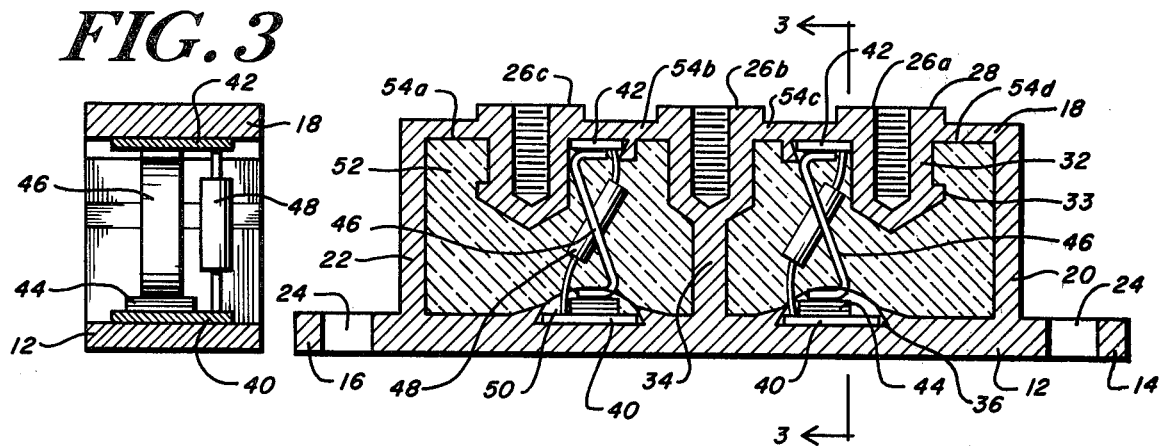
FIG. 2 is a sectional elevation view of the housing of FIG. 1 showing components installed and encapsulated therein.
FIG. 3 is a sectional end view of the embodiment of FIG. 2.

A high power semiconductor package in accordance with the invention is illustrated in FIGS. 1-3 and includes a housing 10 formed of an extruded metal member and cut to an intended width. The housing is sufficient to provide a thermal means for proper heat sinking of the heat generated by the components in the housing. Typically, the housing is aluminum, copper or other suitable metal, and is nickel plated to permit soldering thereto. The housing 10 is illustrated in FIG. 1 prior to assembly of the electronic components therein, and includes a rectangular bottom or base plate 12 terminating in ends 14 and 16, a top wall 18 in parallel spaced relation to the bottom plate 12, and side walls 20 and 22 connecting and integral with the bottom plate 12 and top wall 18. An opening 24 is provided in each end 14 and 16 and by which the package is retained on a mounting surface, such as by threaded fasteners. One or more electrical terminals 26 are included integrally with the housing, three being shown in the illustrated embodiment. The terminals 26a, 26b, and 26c each include an upper portion 28 which is part of the top wall 18 of the housing and which subsequently serves as an electrical contact. Threaded openings 30 can be provided for screw connection to the terminals, either on the top or side as desired. Each terminal also includes a portion 32 inwardly extending in the housing interior toward the bottom plate 12. The outer terminals each include a flange 33 which serves to further anchor the terminal in the encapsulant. The outer terminals 26a and 26c are spaced from the bottom plate 12. A center terminal 26b can be joined to the bottom plate by an integral connecting section 34. A pair of dovetailed recesses 36 are provided in the bottom plate 12, and a pair of dovetailed recesses 38 are formed in the top wall 18 in alignment with the respective recesses 36.

As seen in FIGS. 2 and 3, a conductive plate 40 is retained in each recess 36, and a conductive plate 42 is retained in each recess 38. The plates are of a highly conductive metal such as copper to provide good heat spreading and dissipation, as will be explained below. One or more semiconductor die assemblies 44 are mounted on each plate 40 and are connected to the respective upper plates 42 by respective conductive straps 46, also typically copper. Each die assembly 44 is itself of known construction and includes a suitable disk or plate on which the semiconductor chip is mounted and on top of which another plate or disk can be bonded. The plates serve to provide thermal matching between the chip and the contact strap, and between the chip and the mounting plate. A suitable material for the thermal matching is typically molybdenum or tungsten. These plates also serve as the terminals by which the chip electrodes are connected. A low power active or passive electrical component 48, such as a diode, capacitor, or resistor, can also be connected between the confronting plates 40 and 42 as desirable in a particular electrical circuit configuration.

The confronting pair of copper plates 40 and 42, die assembly 44, and strap 46 are preassembled prior to installation as a unit into housing 10. The die assembly 44 is soldered to plate 40, and strap 46 has one end soldered to the top of the die assembly, and other end soldered to plate 42. This preassembled unit is slidably inserted into confronting recesses 36 and 38 and is mechanically retained therein by the dovetail walls of these recesses. The plates 40 and 42 are prepared so that the plates can be soldered to the confronting surfaces of the housing after installation of the preassembled unit into the housing. After soldering of the assembly, a conformal coat 50 of material such as silicone is provided over each die assembly to provide protection against detrimental effects caused by the encapsulating material. The housing is then encapsulated with an encapsulating material 52 which fills the housing interior to completely enclose the components and terminal structures within the interior. The encapsulating material is preferably provided by transfer molding of an epoxy or other suitable encapsulant within the housing. The encapsulant can also be provided by filling the housing interior with a potting compound which may also be an epoxy material.

Figure 4:
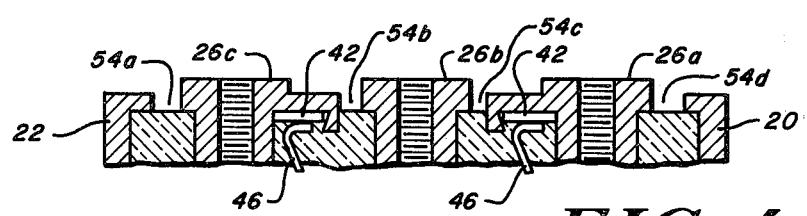
FIG. 4 is a cutaway sectional elevation view of the novel package after removal of selected sections of the housing wall.

After curing of the encapsulant, sections 54a, 54b, 54c, and 54d of the top wall 18 adjacent to the terminals are removed to separate the terminals as required. Removal of these selected sections can be by any convenient means, such as by milling, sawing, or grinding away the associated portions of wall 18 to provide the isolated terminal structure as illustrated in FIG. 4. The center terminal in the illustrated embodiment remains connected to the housing by way of the conductive section 34.

Heat generated by the high power semiconductor element or elements of the die assembly is dissipated into copper plate 40 which serves to spread the heat flow throughout the extent of the plate and to provide efficient dissipation of heat into the bottom plate 12 of the housing. The strap 46 is of "S" or "C" shape to accommodate differences in thermal expansion and contraction. One or more die assemblies can be connected to each electrical terminal depending upon the power requirements of a particular circuit and particular circuit configuration. Electronic components can also be interconnected between adjacent terminals.

Figure 5:
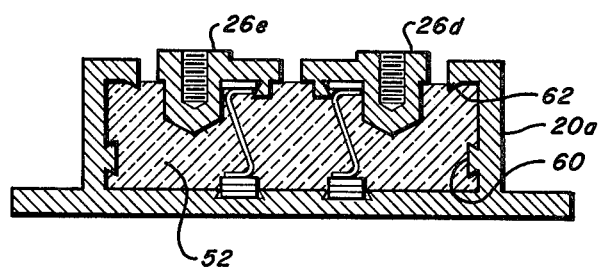
FIG. 5 is a sectional elevation view of a two terminal package after removal of selected sections of the housing wall.

An alternative embodiment is shown in FIG. 5 in which the housing 20a includes two terminals 26d and 26e, each of which is isolated from the housing. A dovetailed flange 60 is provided in each side wall of the housing 20a, and flanges 62 are provided in the top wall for retention of the encapsulant 52 after removal of the selected portions of the housing wall.

Figure 6:
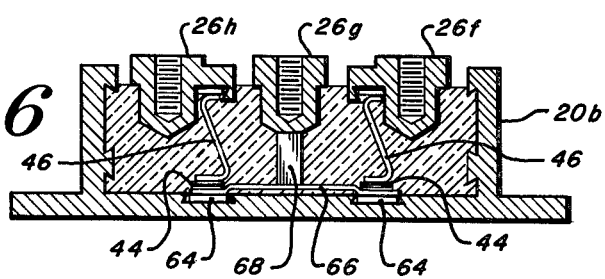
FIG. 6 is a sectional elevation view of a three terminal package in which the terminals are each electrically isolated from the housing.

A further embodiment is shown in FIG. 6 in which three terminals 26f, 26g, and 26h are each electrically isolated from the housing 20b. Plates 64 of electrically insulative material are mounted in the respective recesses in the bottom plate of the housing. A metal strap 66 is provided on insulative plates 64 and extends therebetween in spaced relation from the confronting surface of the housing. The die assemblies 44 are mounted on conductive strap 66 and are connected to the respective terminals 26f and 26h by respective straps 46 as described above. The center terminal 26g is electrically connected to the conductive strap 66 by an interconnecting strap 68. The insulative plates 64 typically can be of alumina or beryllia or of a thin layer of polyimide.

Figure 7:
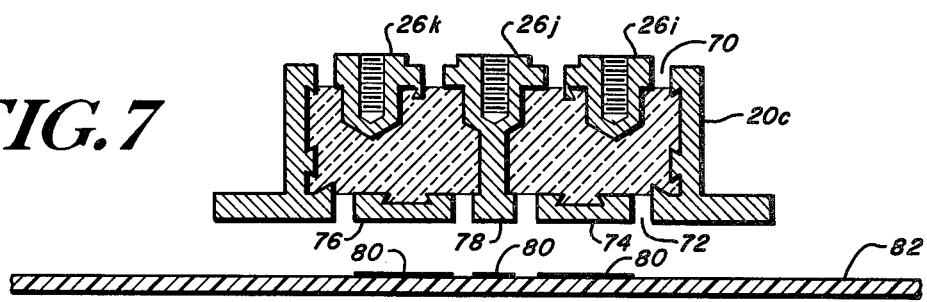
FIG. 7 is a sectional elevation view of an alternative embodiment of the invention wherein top and bottom terminals are provided.

A further embodiment is shown in FIG. 7 wherein terminal areas are provided on the top and bottom of the package housing. For simplicity of illustration, the interior components are omitted, and it will be appreciated that the components and connections can be as shown in the embodiments described above. In this embodiment, sections 70 are removed from the upper wall of housing 20c to provide terminals 26i and 26k, which are electrically isolated from each other and from the housing, and a terminal 26j, which is electrically isolated from the adjacent terminals. Sections 72 are removed from the lower or bottom plate of the housing to provide terminal areas 74 and 76 which are electrically isolated from each other and from the housing, and a terminal area 78 which is isolated from the adjacent terminals 74 and 76 and which is in electrical connecting with the terminal 26j. As an example of a typical mounting arrangement, the bottom terminal areas 74, 76, and 78 can be mounted on and in electrical contact with terminal areas 80 of a circuit board 82.

The width of the housing can be readily varied by cutting the extruded member to a particular width for the purpose of accommodating an intended number of die assemblies and/or other components for a particular circuit configuration. Various alternative implementations and modifications will occur to those skilled in the art without departing from the spirit and true scope of the invention. Accordingly, the invention is not to be limited by what has been particularly shown and described except as indicated in the appended claims.

What is claimed is:

1. A high power semiconductor package comprising:
   a unitary extruded electrically conductive housing having a bottom plate, a top wall, and first and second side walls defining an interior;
   at least two terminal studs, each having an upper portion integral with the top wall and a lower portion within the housing interior in spaced relation to the bottom plate;
   the top wall having intermediate sections adjacent each terminal stud integrally joining the terminal studs and housing;
   at least one semiconductor die assembly mounted on the bottom plate;
   means electrically connecting the die assembly to a terminal stud; and
   an encapsulant in the housing interior;
   the intermediate sections being operative to retain the terminal studs in position prior to encapsulation and which are removable after encapsulation to electrically separate the terminal studs from each other.

2. The package of claim 1 including:
   first retaining means in the bottom plate of the housing;
   second retaining means in the top wall of the housing;
   said at least one semiconductor die assembly being retained by the first retaining means;
   and wherein the means electrically connecting the die assembly to a terminal stud includes conductive means retained by the second retaining means.

3. The package of claim 2 wherein the first retaining means includes a recess integral with the bottom plate of the housing and operative to retain the at least one semiconductor die assembly.

4. The package of claim 3 wherein the conductive means includes a conductive plate retained in each of the retaining means.

5. The package of claim 1 wherein the housing includes a plurality of elements integral with the housing and confronting the housing interior for retaining the encapsulant.

6. The package of claim 1 further including intermediate sections in the bottom plate of the housing and which are removable after encapsulation to electrically separate terminal portions of the bottom plate.

7. The package of claim 1 including a plurality of semiconductor die assemblies;
- a plurality of electrically insulative plates mounted on the bottom plate of the housing;
- a conductive strap mounted on and extending between the insulative plates and in spaced relation to the confronting surface of the housing;
- the die assemblies being mounted on the conductive strap and electrically connected to respective terminal studs.

8. A high power semiconductor package comprising:
- a unitary extruded electrically conductive housing having a bottom plate, a top wall, and first and second side walls defining an interior;
- first retaining means in the bottom plate of the housing;
- second retaining means in the top wall of the housing;
- at least two terminal studs each having an upper portion integral with the top wall, and a lower portion within the housing interior in spaced relation to the bottom plate;
- the top wall having intermediate sections adjacent each terminal stud integrally joining the terminal studs and housing;
- at least one semiconductor subassembly including a first conductive plate adapted for retention by the first retaining means in the bottom plate of the housing, a second conductive plate adapted for retention by the second retaining means in the top wall of the housing, and a semiconductor device mounted on the first plate and connected to the second plate by a conductive interconnection;
- the subassembly being insertable as a unit into the retaining means; and
- an encapsulant in the housing interior;
- the intermediate sections being operative to retain the terminal studs in position prior to encapsulation and which are removable after encapsulation to electrically separate the terminal studs from each other.

9. A high power semiconductor package comprising:
- a unitary extruded electrically conductive housing having a bottom plate, a top wall, and first and second side walls defining an interior;
- at least two terminal studs each having an upper portion integral with the top wall, and a lower portion within the housing interior in spaced relation to the bottom plate;
- the top wall having intermediate sections adjacent each terminal stud integrally joining the terminal studs and housing;
- a plurality of retaining elements integral with the top wall of the housing, each adjacent a respective terminal stud;
- a plurality of retaining elements integral with the bottom plate of the housing, each in alignment with a respective element in the top wall;
- a plurality of first conductive plates, each retained by respective retaining elements in the bottom plate of the housing;
- a plurality of second conductive plates, each retained by respective retaining elements in the top wall of the housing;
- a plurality of semiconductor devices, at least one mounted on each first plate and connected to the corresponding second plate by a conductive interconnection; and
- an encapsulant in the housing interior;
- the intermediate sections of the top wall of the housing being operative to retain the terminal studs in position prior to encapsulation and which are removable after encapsulation to electrically separate the terminal studs from each other.

10. The package of claim 9 wherein said housing includes a plurality of integral elements extending into the housing interior and operative to anchor the encapsulant therein.

11. The package of claim 10 including at least one low power electrical component connected between a confronting first and second conductive plate.

12. The package of claim 9 wherein said housing includes a third terminal stud having an upper portion integral with the top wall, and a lower portion within the housing interior joined to the bottom plate to provide electrical connection to the housing.

13. For use in fabricating a high power semiconductor package, a conductive housing comprising:
- a unitary extruded electrically conductive member having a bottom plate, a top wall, and first and second side walls defining an interior;
- at least two terminal studs each having an upper portion integral with the top wall, and a lower portion within the interior in spaced relation to the bottom plate;
- the top wall having intermediate sections adjacent each terminal stud integrally joining the terminal studs and member;
- a plurality of retaining elements integral with the top wall, each adjacent a respective terminal stud; and
- a plurality of retaining elements integral with the bottom plate, each in alignment with a respective element in the top wall;
- the intermediate sections of the top wall being operative to retain the terminal studs in position during component assembly and encapsulation, and which are removable after encapsulation to electrically separate the terminal studs from each other.

14. A method of fabricating a high power semiconductor package comprising the steps of:
- extruding a unitary electrically conductive housing having a bottom plate, a top wall, and first and second side walls defining an interior, and at least two terminal studs, each having an upper portion integral with the top wall, a lower portion within the housing interior in spaced relation to the bottom plate, and retaining means integral with the top wall and bottom plate of the housing;
- providing one or more semiconductor subassemblies, each including a first conductive plate, a semiconductor device mounted on the first plate, a second conductive plate, and a conductive interconnection between the semiconductor device and the second plate;
- inserting each subassembly as a unit into confronting retaining means on the housing;

filling the housing interior with an encapsulant; and
removing sections of the top wall of the housing to electrically separate the terminal studs from each other.

15. A method of fabricating a high power semiconductor package comprising the steps of:
extruding a unitary electrically conductive housing having a bottom plate, a top wall, and first and second side walls defining an interior, and at least two terminal studs, each having an upper portion integral with the top wall, a lower portion within the housing interior in spaced relation to the bottom plate, and retaining means integral with the top wall and bottom plate of the housing;
installing one or more semiconductor subassemblies in said housing, each electrically connected to a terminal stud and each retained by confronting retaining means of the housing;
filling the housing interior with an encapsulant; and
removing sections of the top wall of the housing to electrically separate the terminal studs from each other.

* * * * *